United States Patent [19]

Sugimoto

[11] 4,168,472
[45] Sep. 18, 1979

[54] VARIABLE GAIN CONTROLLER

[75] Inventor: Yasuhiro Sugimoto, Tokyo, Japan

[73] Assignee: Tokyo Shibaura Electric Co., Ltd., Kanagawa, Japan

[21] Appl. No.: 877,385

[22] Filed: Feb. 13, 1978

[30] Foreign Application Priority Data

Feb. 10, 1977 [JP] Japan ............................ 52/15432[U]

[51] Int. Cl.² ............................................. H03G 3/10
[52] U.S. Cl. .................................. 330/278; 325/414; 330/283; 330/288
[58] Field of Search ................ 325/408, 414; 330/149, 330/278, 283, 288, 303

[56] References Cited

U.S. PATENT DOCUMENTS

| | | | |
|---|---|---|---|
| 4,032,799 | 6/1977 | Sugimoto et al. | 330/283 X |
| 4,045,731 | 8/1977 | Tokunou et al. | 330/149 X |
| 4,048,569 | 9/1977 | Yamatani | 325/414 |

Primary Examiner—Lawrence J. Dahl
Attorney, Agent, or Firm—Oblon, Fisher, Spivak, McClelland & Maier

[57] ABSTRACT

A variable gain controller comprising an amplifier having a feed back terminal which is connected to a variable resistor including a current controller for controlling current flowing through the variable resistor, a filter connected to the variable resistor for attenuating frequency components of input signals in accordance with the values of the variable resistor and a resistor inserted between output terminal of the amplifier and the connection of the variable resistor to the filter.

4 Claims, 12 Drawing Figures

VARIABLE GAIN CONTROLLER

BACKGROUND OF THE INVENTION

This invention relates to a variable gain controller, and more particularly to a variable gain controller utilized for noise reduction systems.

In the past, there has been proposed a gain controller for a noise reduction system such as the Dolby-B noise reduction system which is used to reduce the level of background noise introduced during recording and playback of audio signals on magnetic tape, and to improve the noise level in FM broadcast reception.

The Dolby B-type noise reduction system contains a high-pass dynamic filter circuit comprising a variable resistor which controls the response of the filter and operates to boost low-level high-frequency signals in the encode mode and to attenuate the same signals in a complementary manner in the decode mode.

Consequently, it is said that frequency-gain response (hereinafter called gain response) of the filter can be varied to some extent by means of the variable resistor.

However, the filter circuit is originally designed to pass the low frequency signals, and it does not function as high-pass filter or band-pass filter.

SUMMARY OF THE INVENTION

Accordingly, it is an object of the invention to provide an improved gain controller whose gain response can be varied depending on the purpose thereof.

It is another object of the invention to provide an improved gain controller whose gain response can be varied by a d-c control voltage determined as a function of frequency and the level of the input signal.

A further object of the invention is to provide an improved gain controller whose output signal can be delivered from different output terminals at the same time.

The objects of the invention are achieved by a variable gain controller comprising an amplifier having a feed back terminal which is connected to a variable resistor including a current controller for controlling current flowing through the variable resistor, a filter connected to the variable resistor for attenuating frequency components of input signals in accordance with the values of the variable resistor and a resistor inserted between output terminal of the amplifier and the connection of the variable resistor to the filter.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Before explaining the present invention for full understanding thereof, a conventional gain controller used for a noise reduction system will be described below.

Figure 1:
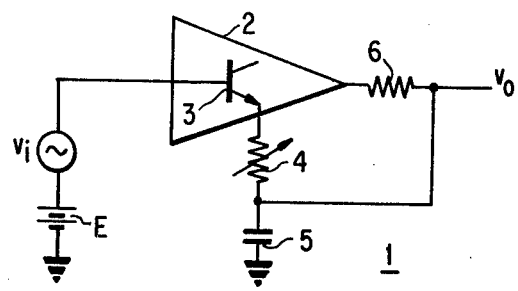
FIG. 1 shows a block diagram of a conventional gain controller.

Referring now to the drawings, wherein like reference numerals designate identical or corresponding parts throughout the several views, and more particularly to FIG. 1 thereof, FIG. 1 shows a conventional gain controller 1 functioning as a low-pass filter, which includes an amplifier 2 comprising n-p-n transistor 3. To the base of the transistor 3, input signal vi superposed on d-c voltage E is applied. The emitter of the transistor 3 is connected to one end of a variable resistor 4 comprised of diodes while the other end of the variable resistor 4 is connected to a capacitor 5 which is grounded.

From the connection of the variable resistor 4 and the capacitor 5, the output Vo is delivered. 6 indicates an output impedance of the amplifier 2.

Figure 2:
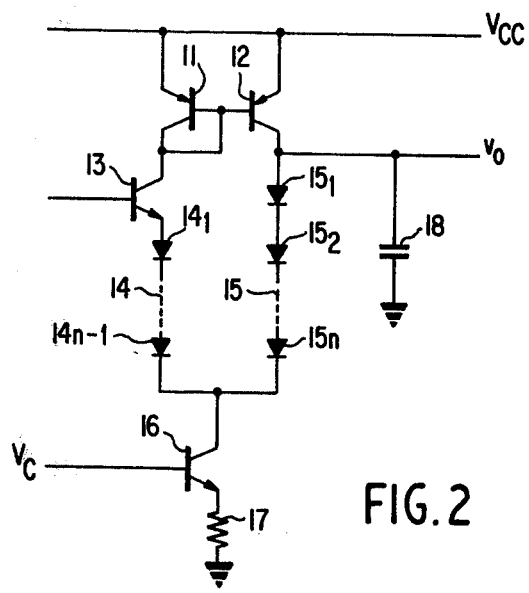
FIG. 2 shows a detailed circuit of the gain controller shown in FIG. 1.

A more detailed illustration of a conventional gain controller is shown in FIG. 2. The gain controller 1 contains a pair of p-n-p transistors 11 and 12, one of which is inserted between a voltage source Vcc and the transistor 13 which exactly corresponds to the transistor 3 as shown in FIG. 1. The pair functions as a 1:1 current converter and also functions as a positive phase amplifier with the transistor 11 of the input signal.

The emitter of the transistor 13 is connected to the anode of a diode 14 which is a part of series circuit 14 consisting of n-1 diodes while the collector of the transistor 12 is connected to the anode of a diode 15, which is a part of another series circuit 15 consisting of n diodes.

The cathodes of outer diodes $14_{n-1}$, $15n$ of the series circuits 14, 15 are mutually connected and the junction of the series circuits 14, 15 is connected to the collector of a transistor 16 which is controlled by a d-c control voltage Vc. The emitter of the transistor 16 is connected to ground through a resistor 17. Accordingly, series diode circuits 14, 15 and transistor 16, more particularly, the base-emitter junction of the transistor 16, constitute the variable resistor.

A capacitor 18 which is connected between output terminal Vo and ground potential corresponds to the capacitor 5 as shown in FIG. 1.

Having mentioned the above, the operation of the gain controller will now be described below.

The output signal Vo is expressed by the following equation when an input signal Vi is applied to the base of the transistor 13.

$$Vo = 1/1 + j\omega CR \cdot Vi \; (r_o \gg R//Zc)$$

where

R represents the value of the variable resistor 14

C represents the value of the capacitor 18

$\omega$ represents $2\pi f$ where f is the frequency of input signal Vi $r_o$ represents the output impedance of the positive phase amplifier and $Z_c$ represents impedance of the capacitor 18.

According to the equation, it is understood that the gain controller shown in FIG. 1 or FIG. 2 functions as a low-pass filter and contains a negative feedback loop.

At low levels of the control voltage $V_c$, current passing through the base-emitter junction of the transistor 16 and the diodes 14 and 15 is so small that R becomes a large value. Then the cutoff frequency of the gain controller is lowered. When the control voltage $V_c$ is low, the frequency response characteristic is illustrated by curve a in FIG. 3.

Figure 3:
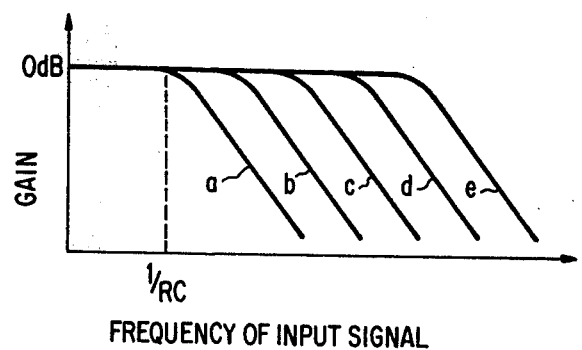
FIG. 3 shows a graph illustrating gain response of the circuit shown in FIG. 2.

By increasing the control voltage $V_c$, the resistance R is reduced and the cutoff frequency of the controller is gradually raised as illustrated by curves (b) to (e) of FIG. 3.

Consequently, the gain controller mentioned above is utilized in a noise reduction system which attenuates unwanted high frequency signals. However, because of attenuating only high frequency signals, the gain controller is not used for the noise reduction system boosting high frequency signals like the Dolby B-type noise reduction system.

In connection with this circumstance, this invention is presented.

Figure 4:
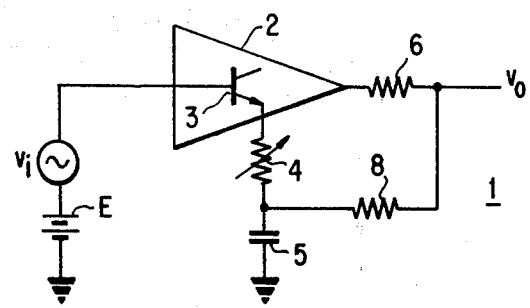
FIG. 4 shows a block diagram of an improved gain controller in accordance with the invention.

Referring now to FIG. 4 to FIG. 8(b), where like reference characters designate identical or corresponding elements through several figures, FIG. 4 is a block diagram of one embodiment of this invention. The major difference between the conventional gain controller as shown in FIG. 1 and the improved gain controller as shown in FIG. 4 is the insertion of a feedback resistor 8 connected between the output Vo' and the connection of the capacitor 5 and the variable resistor 4. As a result of insertion of the resistor 8, a new equation representing the relationship between an input signal Vi and the output signal Vo will be given as follows.

$$Vo' \simeq 1 + j\omega CR_1 / 1 + j\omega CR \ Vi \ (r_o >> R_1 + R//Z_c)$$

where $R_1$ is the value of the resistor 8

From this equation, it is understood that the controller as shown in FIG. 4 has same type of transfer function as a band-pass filter. Accordingly, the frequency response characteristic of the gain controller is plotted as shown in FIG. 5.

Figure 5:
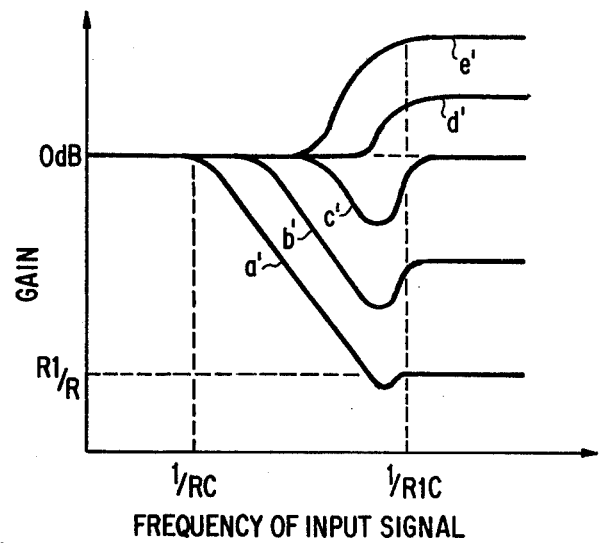
FIG. 5 shows a graph illustrating gain response of the gain controller shown in FIG. 4.

At a low control voltage $V_c$ and with the variable resistor R adjusted to be negligibly small as compared with the resistance $R_1$, ($R_1 << R$) the frequency response characteristic is illustrated as curve a' in FIG. 5. This curve a' has almost the same frequency response as the curve shown in FIG. 3 except for minimum gain for high frequency imput signals.

By gradually increasing the control voltage $V_c$ and adjusting the resistance of the variable resistor 4 to have the same value as the resistance 8, a band-pass filter type of frequency response curve C' is plotted having cutoff frequencies at $1/RC$ and $1/R_1C$, as shown in FIG. 5.

When the value of the variable resistor 4 reduces the value of resistor 8 ($R<R_1$), the frequency response characteristic is plotted as curve d' and e' in FIG. 5. The curves d' and e' show the same charcteristics as a high-pass filter.

Consequently, a gain controller in accordance with this invention can be obtained with several features, such as that of a low-pass filter, a band-pass filter and a high-pass filter by varying the control voltage $V_c$.

Figure 6:
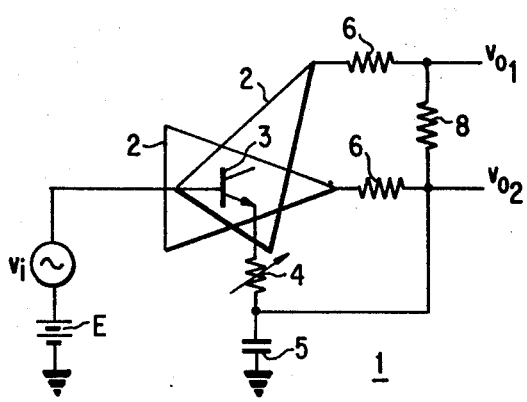
FIG. 6 shows a block diagram of another gain controller in accordance with the invention.
Figure 7:
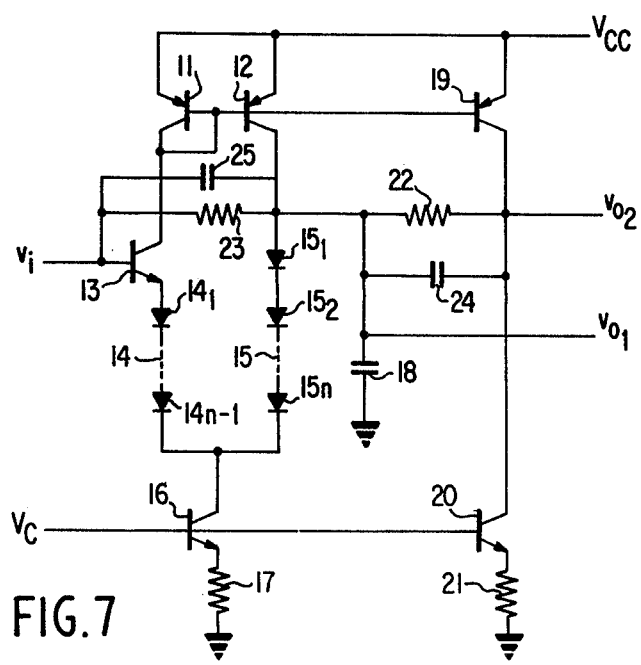
FIG. 7 shows a specific embodiment of the circuit of the gain controller shown in FIG. 6, FIG. 8($a$), 8($b$) shows graphs illustrating gain response of the circuit shown in FIG. 7.

One application in accordance with the invention is shown in FIG. 6 as a combination of FIG. 1 and FIG. 4, and its detailed circuit is shown in FIG. 7.

New elements appearing in FIG. 7 are p-n-p transistor 19, n-p-n transistor 20, resistors 21, 22, 23 and capacitors 24, 25.

Transistor 19 whose collector is mutually connected to the collector of transistor 20 is connected in parallel to the transistor 12. In between the collectors of the transistor 12 and 19, resistor 22 is inserted. The capacitor 25 is inserted between the input terminal and the collector of the transistor 12 used for gain suppression of the controller 1. A control voltage $V_c$ is also applied to the base of the transistor 20 and the current passing through the transistor 20 is regulated by the resistor 21 whose value is double that of the resistor 17.

The resistor 23 and capacitor 24 are used to prevent the gain controller from oscillating.

Then, the current passing through the transistor 20 is reduced to one-half that of the transistor 16.

From the circuit as shown in FIG. 7, it is observed that a first amplifier is constituted by the transistors 11, 12, 13 and a second amplifier is constituted by the transistors 11, 12, 19. The output of the first amplifier and the second amplifier are indicated as $V_{o1}$ and $V_{o2}$ respectively.

Figure 8A:
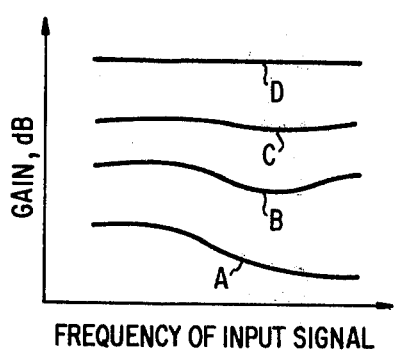

If a d-c control voltage $V_c$ is given as a product of the frequency and level of the input signal, then several frequency response curves are obtained for signals delivered from the output terminal Vo, (FIG. 8(a)). Similarly, frequency response curves for signals delivered from the output terminal $V_{o2}$ are also obtained (FIG. 8(b)).

Therefore, different modes of curves such as a high-pass filter mode, a low-pass filter mode or a band-pass filter are obtained from the output terminals at the same time by varying the control voltage $V_c$.

Figure 8B:
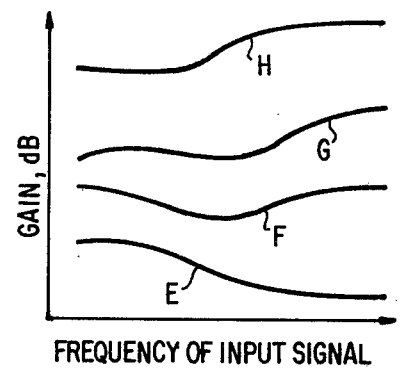
Figure 9:
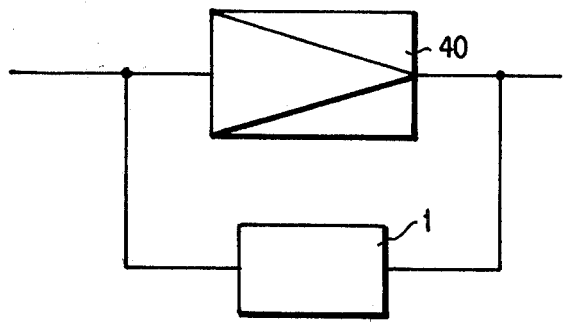
FIG. 9 shows a block diagram of still another gain controller and FIG. 10($a$), 10($b$) shows graphs illustrating gain response of the gain controller as shown in FIG. 9.
Figure 10A:
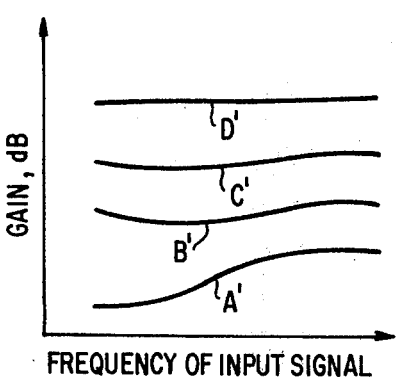
Figure 10B:
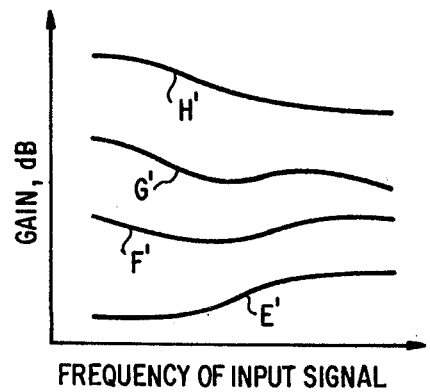

This gain controller 1 is used as a feedback loop in combination frequency response to FIGS. 8(a), 8(b), can be obtained (FIGS. 10(a), 10(b)).

As described above, the variable gain controller of this invention can present several different types of frequency response curves according to the purpose thereof.

Obviously, many modifications and variations of this invention are possible in the light of the above teachings.

What is claimed as new and desired to be secured by Letters Patent of the United States is:

1. A variable gain controller comprising:
    an amplifier having a feedback terminal and an output terminal;
    a variable first resistor having one end connected to said feedback terminal, said variable first resistor including a plurality of diode circuits and current controller means for controlling current flowing therethrough; and
    filter means connected to the other end of said variable first resistor for attenuating frequency components of input signals according to the values of said variable first resistor and a second resistor inserted between the output terminal of said amplifier and the connection of said variable first resistor and said filter means.

2. A variable gain controller including:
    a first amplifier having a feedback terminal and an output terminal;

a variable first resistor having one end connected to said feedback terminal, said variable first resistor including a plurality of diode circuits and current controller means for controlling current flowing therethrough;

filter means connected to the other end of said variable first resistor for attenuating frequency components of input signals according to the values of said variable first resistor;

a second resistor, one end of said second resistor connected to the output terminal of said first amplifier and the other end of said second resistor connected to the connection of said variable first resistor and filter means; and a second amplifier including a feedback terminal and an output terminal; wherein said feedback terminal of said first amplifier and said feedback terminal of said second amplifier are mutually connected, and the other end of said second resistor is also connected to the output terminal of said second amplifier whereby different responses are delivered from each of said output terminals at the same time.

3. A variable gain controller set forth in claim 1 wherein:

said amplifier includes at least one transistor, and said filter means includes a capacitor.

4. A variable gain controller set forth in claim 2 wherein:

each of said first amplifier and second amplifier includes at least one transistor, and said filter means is a capacitor.

* * * * *